US009553096B2

(12) United States Patent
Hsu et al.

(10) Patent No.: US 9,553,096 B2
(45) Date of Patent: Jan. 24, 2017

(54) SEMICONDUCTOR ARRANGEMENT WITH CAPACITOR

(71) Applicant: Taiwan Semiconductor Manufacturing Company Limited, Hsin-Chu (TW)

(72) Inventors: Chern-Yow Hsu, Chu-Bei (TW); Shih-Chang Liu, Alian Township (TW); Chia-Shiung Tsai, Hsin-Chu (TW); Xiaomeng Chen, Hsinchu (TW); Chen-Jong Wang, Hsinchu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 14/087,009

(22) Filed: Nov. 22, 2013

(65) Prior Publication Data
US 2015/0145101 A1 May 28, 2015

(51) Int. Cl.
*H01L 21/02* (2006.01)
*H01L 27/108* (2006.01)
*H01L 23/58* (2006.01)
*H01L 49/02* (2006.01)
*H01L 23/522* (2006.01)

(52) U.S. Cl.
CPC ....... *H01L 27/10814* (2013.01); *H01L 23/585* (2013.01); *H01L 27/10817* (2013.01); *H01L 27/10852* (2013.01); *H01L 27/10855* (2013.01); *H01L 27/10894* (2013.01); *H01L 28/87* (2013.01); *H01L 28/91* (2013.01); *H01L 23/5223* (2013.01); *H01L 2924/0002* (2013.01); *H01L 2924/1431* (2013.01); *H01L 2924/1434* (2013.01)

(58) Field of Classification Search
CPC .................................................. H01L 27/10814
See application file for complete search history.

(56) References Cited

U.S. PATENT DOCUMENTS

| | | | | |
|---|---|---|---|---|
| 5,488,011 A | * | 1/1996 | Figura et al. | 438/253 |
| 6,326,218 B1 | * | 12/2001 | Yunogami | H01L 21/32139 |
| | | | | 257/E21.009 |
| 6,624,018 B1 | * | 9/2003 | Yu et al. | 438/239 |
| 6,794,694 B2 | | 9/2004 | Diodato et al. | |
| 2002/0022317 A1 | * | 2/2002 | Fukuzumi | 438/253 |

* cited by examiner

*Primary Examiner* — Marc Armand
*Assistant Examiner* — Sarah Salerno
(74) *Attorney, Agent, or Firm* — Cooper Legal Group, LLC

(57) ABSTRACT

A semiconductor arrangement includes a logic region and a memory region. The memory region has an active region that includes a semiconductor device. The memory region also has a capacitor within one or more dielectric layers over the active region. The semiconductor arrangement includes a protective ring within at least one of the logic region or the memory region and that separates the logic region from the memory region. The capacitor has a first electrode, a second electrode and an insulating layer between the first electrode and the second electrode, where an electrode unit of the first electrode has a first portion and a second portion, and where the second portion is above the first portion and is wider than the first portion.

20 Claims, 11 Drawing Sheets

SEMICONDUCTOR ARRANGEMENT WITH CAPACITOR

BACKGROUND

Capacitors are useful to, among other things, store electrical charge within circuits.

DESCRIPTION OF THE DRAWINGS

Aspects of the disclosure are understood from the following detailed description when read with the accompanying drawings. It will be appreciated that elements and/or structures of the drawings are not necessarily be drawn to scale. Accordingly, the dimensions of the various features may be arbitrarily increased and/or reduced for clarity of discussion.

DETAILED DESCRIPTION

Figure 1:
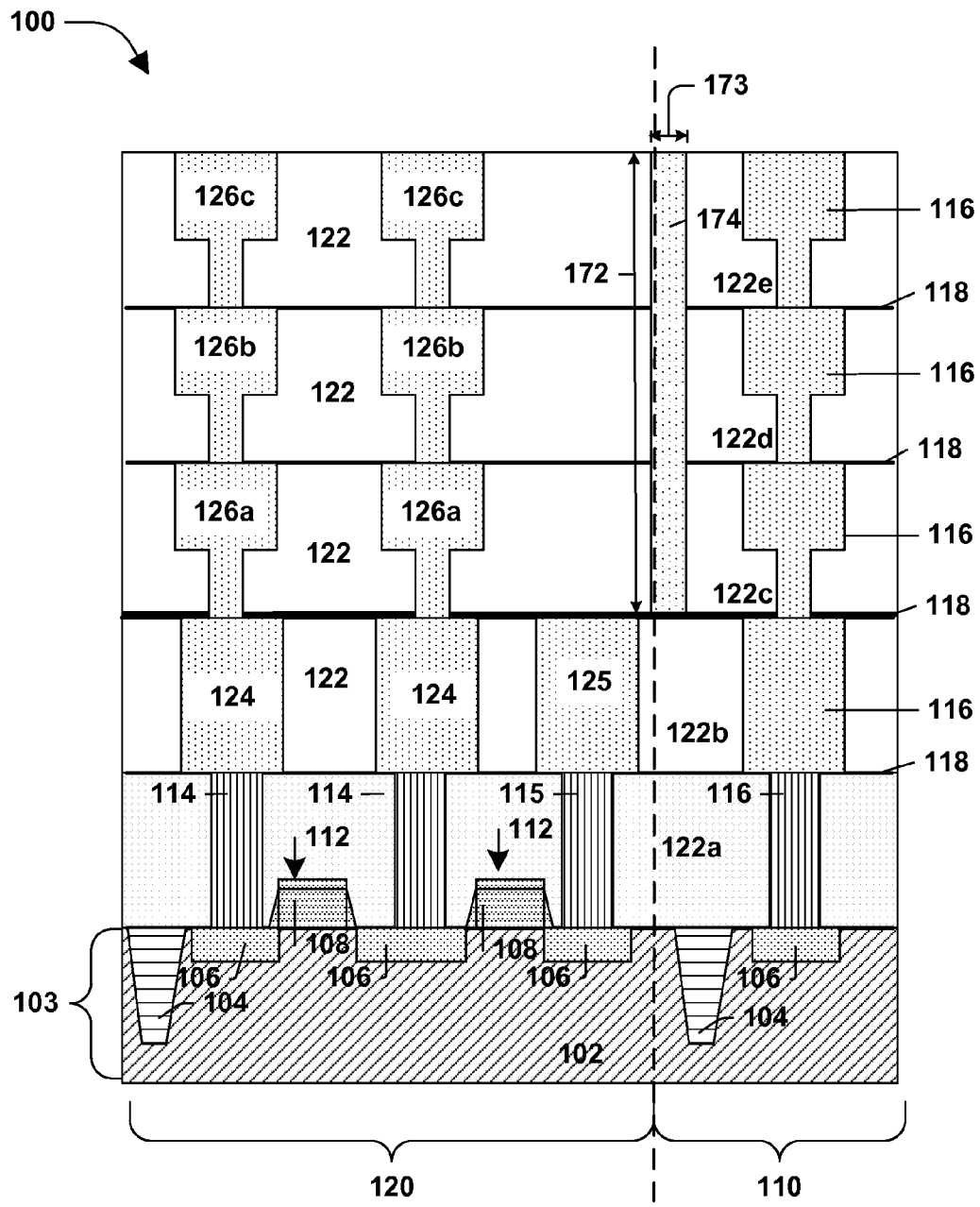
FIG. 1 illustrates a portion of a semiconductor arrangement, according to some embodiments.

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter may be practiced without these specific details. In other instances, structures and devices are illustrated in block diagram form in order to facilitate describing the claimed subject matter.

One or more techniques for forming a semiconductor arrangement and resulting structures formed thereby are provided herein.

FIG. 1 is a perspective view illustrating a portion of a semiconductor arrangement 100 according to some embodiments. In some embodiments, the semiconductor arrangement 100 is formed in or on a substrate 102, where an active region 103 is formed in the substrate 102. In some embodiments, the substrate 102 comprises at least one of silicon, polysilicon, or germanium. According to some embodiments, the substrate 102 comprises at least one of an epitaxial layer, a silicon-on-insulator (SOI) structure, a wafer, or a die formed from a wafer.

According to some embodiments, the semiconductor arrangement 100 comprises a logic region 110 and memory region 120. In some embodiments, the logic region 110 is formed on or within the active region 103. In some embodiments, the logic region 110 comprises one or more logic contacts 116 that are electrically connected within the logic region 110 and connected to the active region 103. The logic contacts 116 are formed in any number of ways, such as by a single damascene process, dual damascene process, etc.

According to some embodiments, the memory region 120 comprises one or more DRAM cells (not shown). In some embodiments, the memory region 120 comprises a semiconductor device 112 formed on or within the active region 103. In some embodiments, the semiconductor device 112 comprises at least one of gate region 108 or a source/drain region 106. In some embodiments, one or more shallow trench isolation (STI) regions 104 are formed within the active region 103. In some embodiments, the memory region 120 comprises one or more contacts 114 that are electrically connected to the source/drain regions 106.

In some embodiments, the semiconductor arrangement 100 comprises one or more dielectric layers 122 formed over the active region 103. According to some embodiments, the one or more dielectric layers 122 comprise a first dielectric layer 122a, a second dielectric layer 122b, a third dielectric layer 122c, a fourth dielectric layer 122d, and a fifth dielectric layer 122e, although any number of dielectric layers are contemplated. In some embodiments, at least one of the dielectric layers 122 comprise a standard dielectric material with a medium or low dielectric constant, such as $SiO_2$. In some embodiments, at least one of the dielectric layers 122 comprise a dielectric material with a relatively high dielectric constant. In some embodiments, formation of at least one of the dielectric layers 122 comprises at least one of thermal growth, chemical growth, atomic layer deposition (ALD), chemical vapor deposition (CVD), or plasma-enhanced chemical vapor deposition (PECVD).

In some embodiments, the semiconductor arrangement 100 comprises one or more etch stop layers 118 separating the dielectric layers 122. In some embodiments, the etch stop layers 118 stop an etching process between the dielectric layers 122. According to some embodiments, the etch stop layers 118 comprise a dielectric material having a different etch selectivity from the dielectric layers 122. In some embodiments, at least one of the etch stop layers 118 comprise at least one of SiC, SiN, SiCN, SiCO, or CN. In some embodiments, formation of at least one of the etch stop layers 118 comprises at least one of thermal growth, chemical growth, atomic layer deposition (ALD), chemical vapor deposition (CVD), or plasma-enhanced chemical vapor deposition (PECVD).

In some embodiments, the semiconductor arrangement 100 comprises a bit line 125. In some embodiments, the bit line 125 extends through the second dielectric layer 122b. According to some embodiments, the bit line 125 comprises a metal material and is connected to a source/drain region 106 through a contact 115.

In some embodiments, the semiconductor arrangement 100 comprises one or more metal contacts 124. In an embodiment, the metal contacts 124 extend through the second dielectric layer 122b. In some embodiments, the metal contacts 124 provide an electrical connection through at least one of the dielectric layers 122 to the semiconductor device 112 of the active region 103. The metal contacts 124 are formed in any number of ways, such as by a single damascene process, dual damascene process, etc. In some embodiments, the metal contacts 124 are connected to the source/drain regions 106 through contacts 114.

In some embodiments, the semiconductor arrangement 100 comprises one or more metal structures 126. In an embodiment, the one or more metal structure 126 comprises a first metal structure 126a, a second metal structure 126b and a third metal structure 126c, although any number of metal structures are contemplated. In some embodiments, the metal structures 126 extend through the third dielectric layer 122c, the fourth dielectric layer 122d and the fifth dielectric layer 122e. In some embodiments, the metal structures 126 comprise copper. In some embodiments, the metal structure comprises a copper glue layer, such as TaN or TiN. The metal structures 126 are formed in any number of ways, such as by a single damascene process, dual damascene process, etc. In some embodiments, the metal structures 126 are electrically connected to the source/drain regions 106 through the metal contact 124 and contacts 114.

In some embodiments, the semiconductor arraignment 100 comprises a protective ring 174. In some embodiments, formation of the protective ring 174 comprises at least one of atomic layer deposition (ALD), sputtering, thermal evaporation or chemical vapor deposition (CVD). In some embodiments, the protective ring 174 has a protective ring width 173. In some embodiments, the protective ring width 173 is between about 1 nm to about 100 nm. In some embodiments, the protective ring 174 has a protective ring height 172. In some embodiments, the protective ring height 174 is between about 250 nm to about 1200 nm. In some embodiments, the protective ring 174 comprises a conductive material. In some embodiments, the conductive material comprises at least one of Ti, TiN, Ta, TaN, TaC, W, Ir, Ru, Pt, aluminum, copper, polysilicon or a composite thereof.

Figure 2:
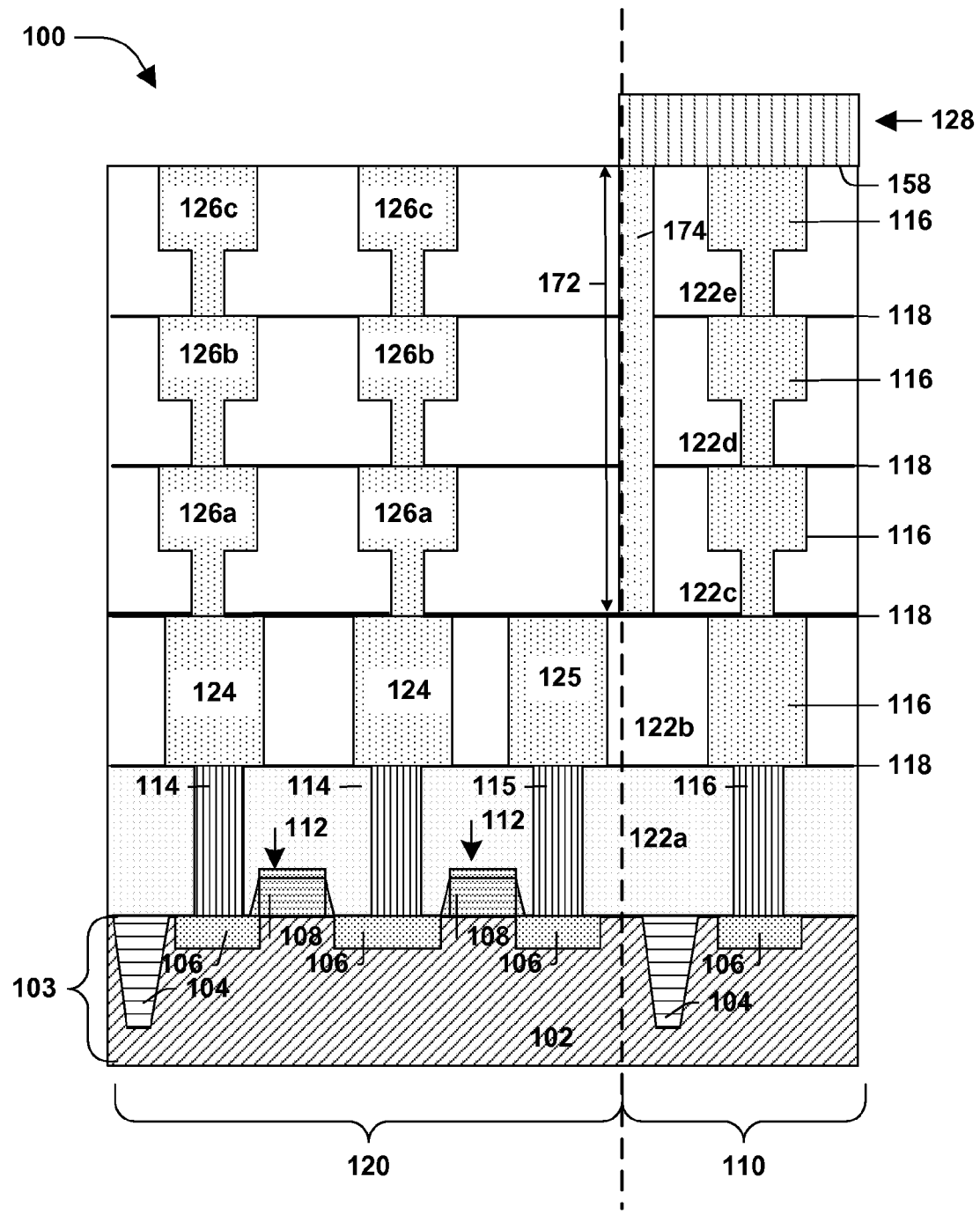
FIG. 2 illustrates a portion of a semiconductor arrangement, according to some embodiments.

Turning to FIG. 2, according to some embodiments, a first mask layer 128 is formed over a logic region surface 158 on the fifth dielectric layer 122e and over the protective ring 174. In some embodiments, formation of the first mask layer 128 comprises at least one of deposition, chemical vapor deposition (CVD), or other suitable methods. In some embodiments, the first mask layer 128 comprises at least one of oxides, silicon oxide, nitrides, silicon nitride, or $Si_3N_4$.

Figure 3:
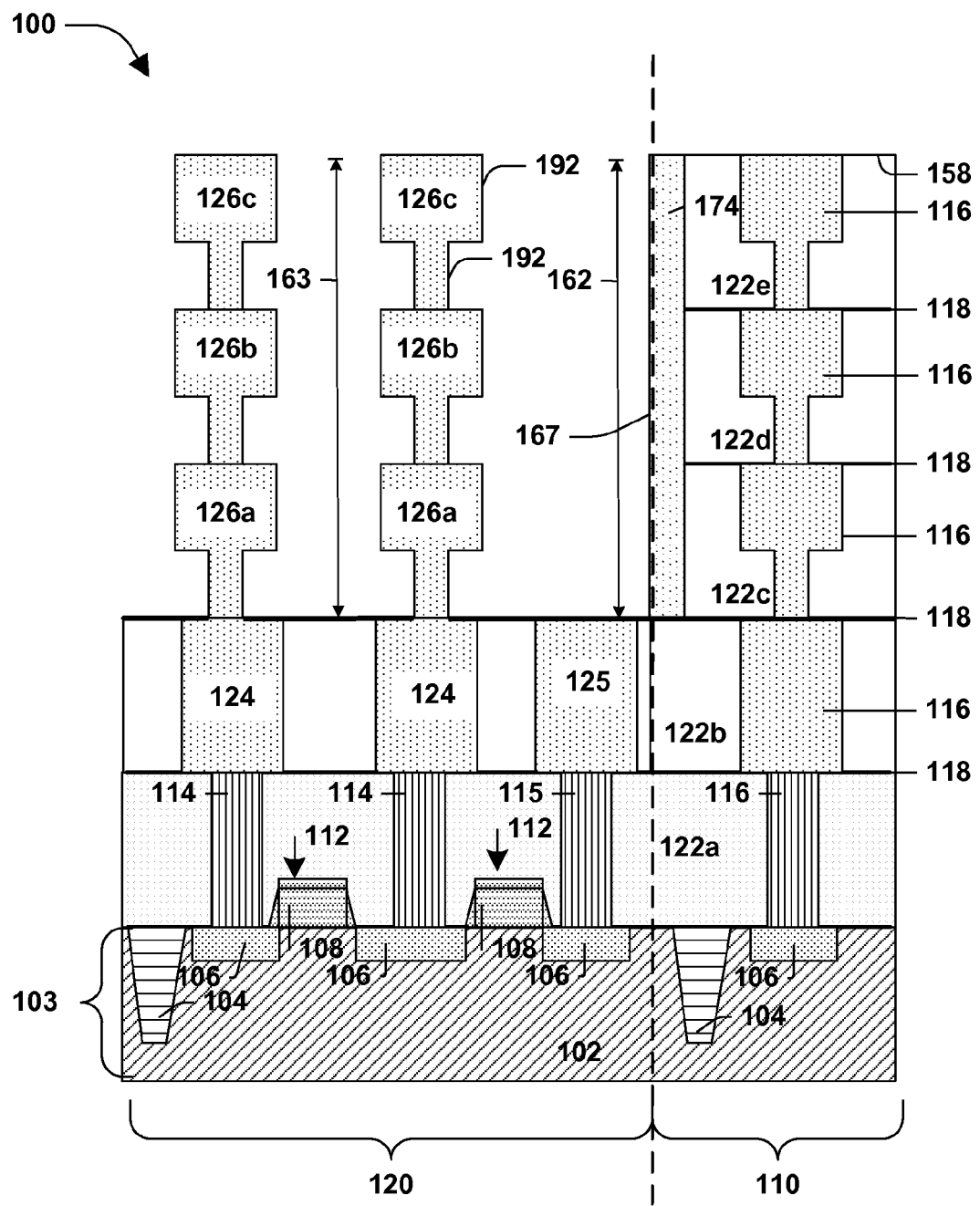
FIG. 3 illustrates a portion of a semiconductor arrangement, according to some embodiments.

Turning to FIG. 3, according to some embodiments, at least some of the dielectric layers 122 are removed to expose sidewalls 192 of the metal structures 126 and a sidewall 167 of the protective ring 174. In some embodiments, the dielectric layers 122 are removed to reveal at least one of the third metal structure 126c, the second metal structure 126b, or the first metal structure 126a. In some embodiments, the removal of the dielectric layers 122 comprises etching at least one of the fifth dielectric layer 122e, the fourth dielectric layer 122d or the third dielectric layer 122c, and then removing the protective first mask layer 128. In some embodiments, the dielectric layers 122 are removed from the metal structures 126 using an isotropic etch. According to some embodiments, an etch chemistry for etching through at least one of the fifth dielectric layer 122e, the fourth dielectric layer 122d or the third dielectric layer 122c comprises at least one of $C_5F_8$, $C_4F_6$, $N_2$, or Ar. According to some embodiments, an etch chemistry for etching through at least one of the fifth dielectric layer 122e, the fourth dielectric layer 122d or the third dielectric layer 122c comprises a hydrogen fluoride (HF) base wet etching method. In some embodiments, an etch time for etching through at least one of the fifth dielectric layer 122e, the fourth dielectric layer 122d or the third dielectric layer 122c is between about 3 minutes to about 6 minutes. In some embodiments, an etch chemistry for etching through at least one of the etch stop layers 118 between the fifth dielectric layer 122e, the fourth dielectric layer 122d and the third dielectric layer 122c comprises at least one of $CF_4$, $N_2$, or Ar. According to some embodiments, an etch chemistry for etching through at least one of the etch stop layers 118 between the fifth dielectric layer 122e, the fourth dielectric layer 122d and the third dielectric layer 122c comprises a hydrogen fluoride (HF) base wet etching method.

In some embodiments, a first depth 162, created by the removal of the dielectric layers 122 between the metal structures 126 and the protective ring, is controlled by at least one of a timed etch or endpoint detection process. In some embodiments, the first depth 162 is between about 250 nm to about 1200 nm. In some embodiments, a second depth 163, created by the removal of the dielectric layers 122 between the metal structures 126, is controlled by at least one of a timed etch or endpoint detection process. In some embodiments, the second depth 163 is between about 250 nm to about 1200 nm. In some embodiments, the first depth 162 and the second depth 163 are different depths.

Figure 4:
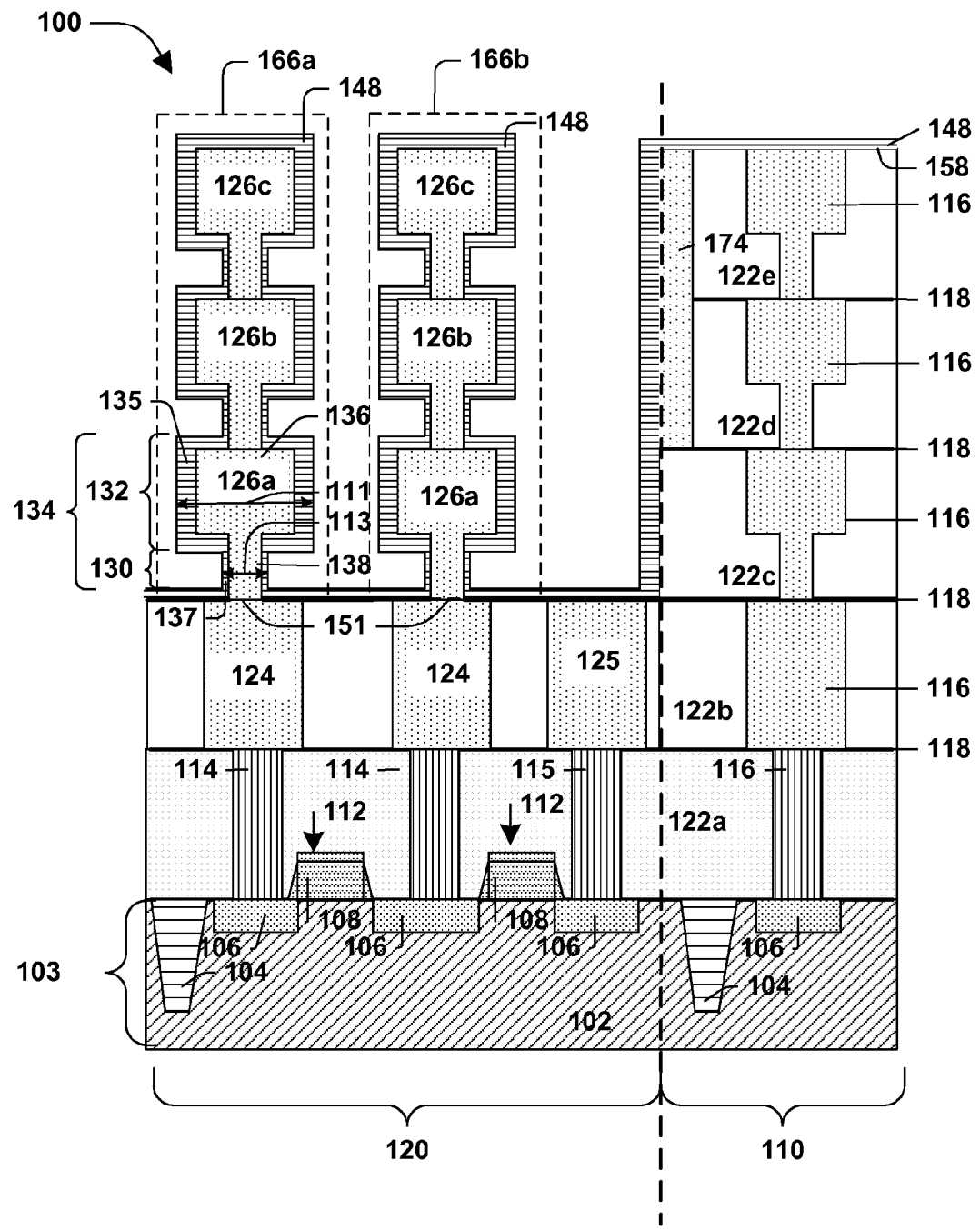
FIG. 4 illustrates a portion of a semiconductor arrangement, according to some embodiments.

Turning to FIG. 4, according to some embodiments, a first electrode layer 148 is formed over the metal structures 126 to form a first electrode 166. Although two electrodes 166a, 166b are illustrated, any number of electrodes are contemplated. In some embodiments, the first electrode layer 148 is also formed over the protective ring 174, an etch stop layer 118, the second dielectric layer 122b, and the fifth dielectric layer 122e. In some embodiments, such as depending upon prior etching processes, an etch stop layer 118 is not exposed and thus the first electrode layer 148 is not formed thereover. In some embodiments, such as depending upon prior etching processes, one or more other dielectric layers 122 are exposed in addition to or in alternative to the second dielectric layer 122b such that the first electrode layer 148 is formed over the second dielectric layer 122b and over one or more other dielectric layers 122 or is formed over one or more other dielectric layers 122 but not over the second dielectric layer 122b. In some embodiments, formation of the first electrode layer 148 comprises at least one of atomic layer deposition (ALD), sputtering, thermal evaporation or chemical vapor deposition (CVD). According to some embodiments, a portion of the first electrode layer 148 is formed over the logic region surface 158 of the fifth dielectric layer 122e. In some embodiments, the first electrode layer 148 comprises a conductive material. In some embodiments, the conductive material comprises at least one of Ti, TiN, Ta, TaN, TaC, W, Ir, Ru, Pt, aluminum, copper, polysilicon or a composite thereof.

In some embodiments, the first electrode 166 comprises at least a first electrode unit 134, although any number of electrode units are contemplated. In some embodiments, the first electrode unit 134 comprises the first electrode layer 148 around the first metal structure 126a. In some embodiments, a first electrode unit 134 comprises a first portion 130 having a first width 113, and a second portion 132 having a second width 111, the first width 113 less than the second width 111. In some embodiments, an area of the first portion 130 is less than an area of the second portion 132. In some embodiments, the first portion 130 is connected to the metal contact 124. In some embodiments, the first portion 130 of the first electrode unit 134 comprises a first portion 138 of the first metal structure 126a and a first portion 137 of the first electrode layer 148. In some embodiments, the second portion 132 of the first electrode unit 134 comprises a second portion 136 of the first metal structure 126a and a second portion 135 of the first electrode layer 148.

According to some embodiments, at least three dielectric layers 122 are between a bottom surface 151 of the first electrode 166 and the active region 103. According to some embodiments, at least one dielectric layer 122 is between the bottom surface 151 and the active region 103. In some embodiments, the at least one dielectric layer 122 between the bottom surface 151 and the active region 103 comprises the first dielectric layer 122a. According to some embodiments, at least one dielectric layer 122 is between the bottom surface 151 and the bit line 125 disposed above the active region 103. In some embodiments, the at least one dielectric layer 122 between the bottom surface 151 and the bit line 125 comprises the third dielectric layer 122c. In some embodiments, the dielectric layer 122 in contact with the bottom surface 151 also contains the bit line 125 disposed above the active region 103.

Figure 5:
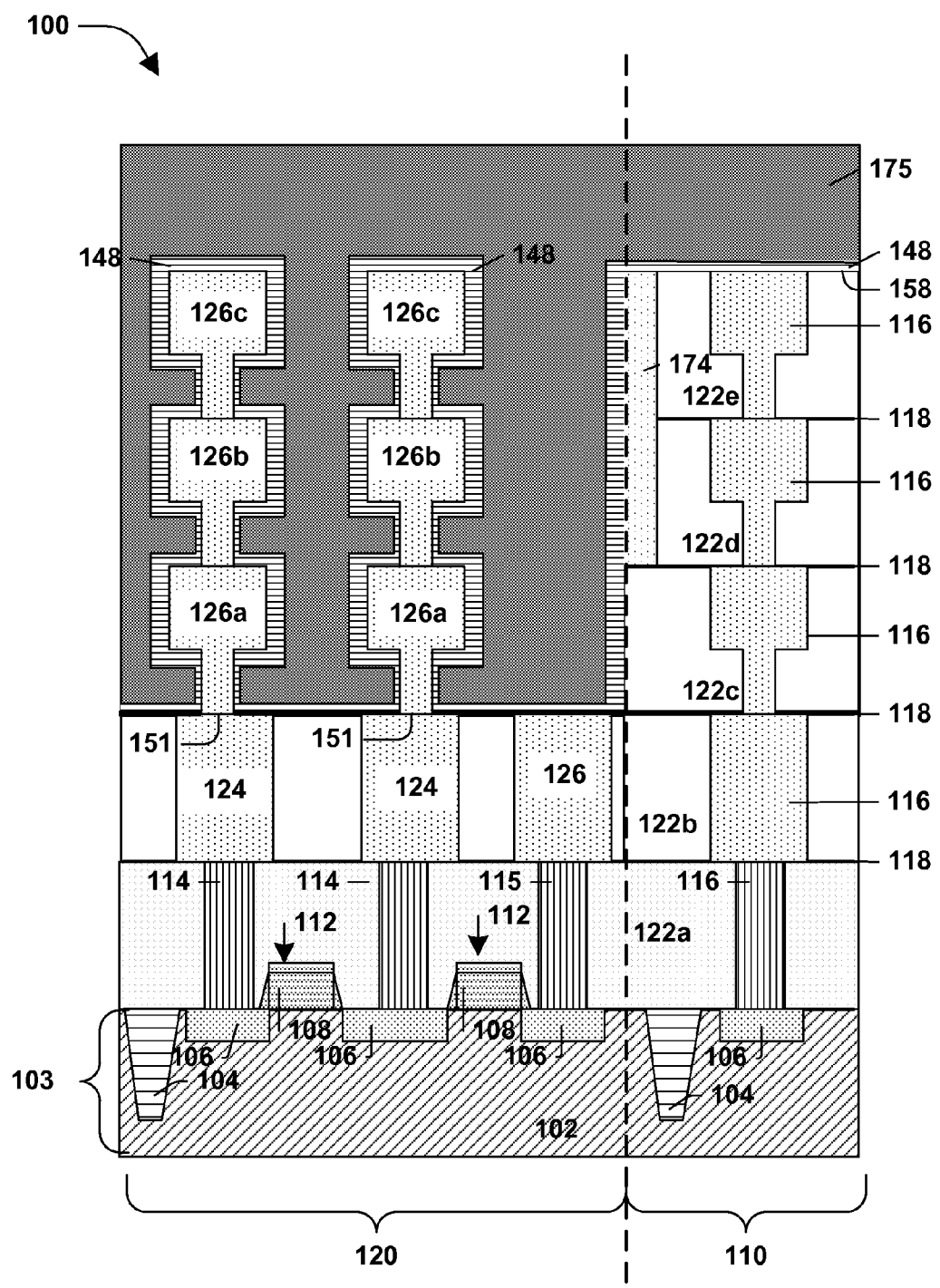
FIG. 5 illustrates a portion of a semiconductor arrangement, according to some embodiments.

Turning to FIG. 5, in some embodiments, a bottom anti-reflective coating (BARC) layer 175 is formed over the first electrode layer 148. The BARC layer 175 comprises any number of materials, including silicon, SiOC, other semiconductor materials, etc.

Figure 6:
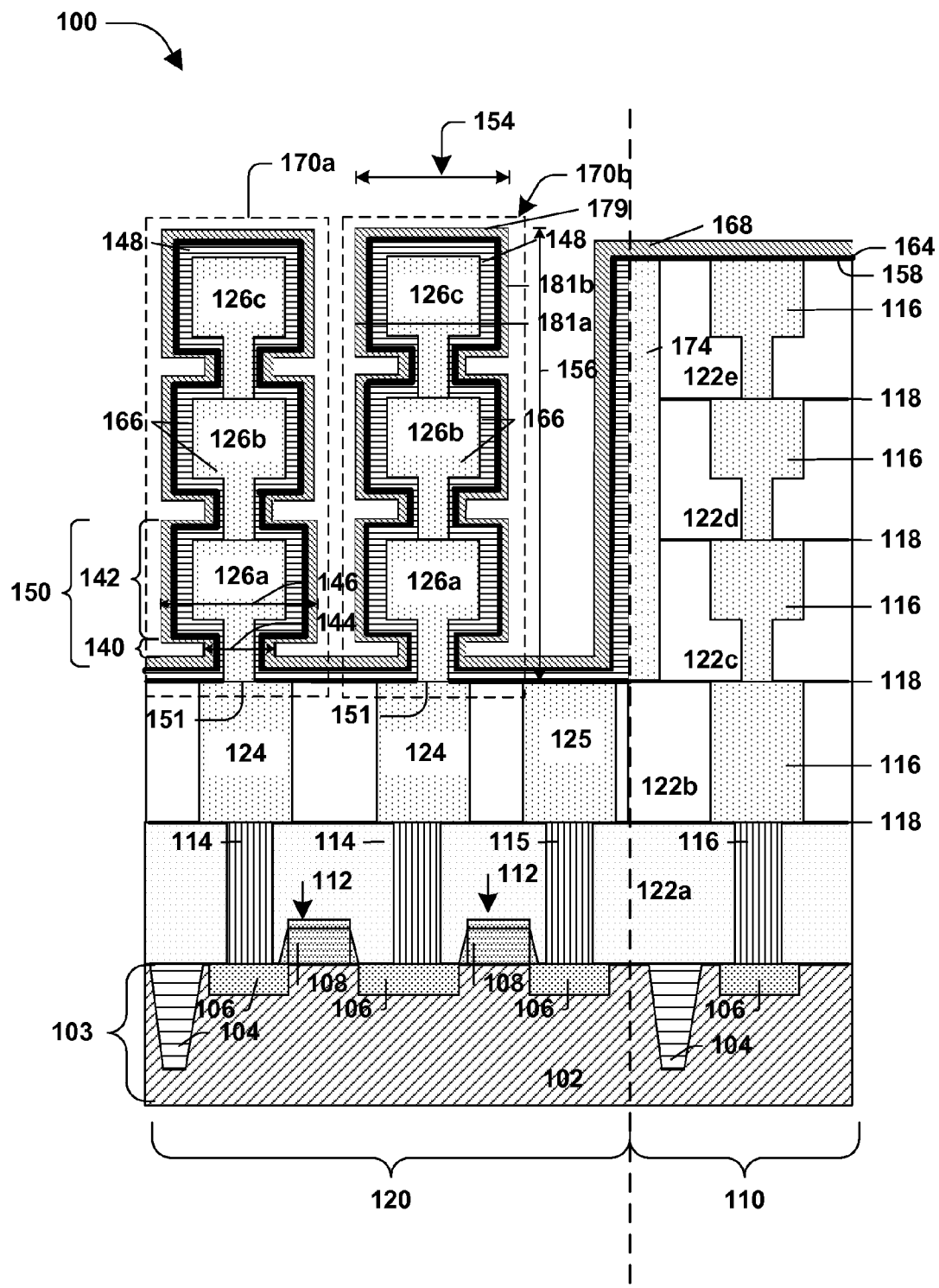
FIG. 6 illustrates a portion of a semiconductor arrangement, according to some embodiments.

Turning to FIG. 6, in some embodiments, the BARC layer 175 and a surface portion of the first electrode layer 148 over the logic region surface 158 are removed, such as by wet etching, dry etching, etc. In some embodiments, an etch chemistry for etching through and removing the BARC layer 175 comprises at least one of CO, $CO_2$, $H_2$, $CF_4$, $CHF_3$, $CH_2F_2$, $SF_6$, $O_2$, $N_2$, Ar, He, or $Cl_2$. In some embodiments, a chemical mechanical polishing (CMP) process is used to remove at least some of the BARC layer 175 and the surface portion of the first electrode layer 148 over the logic region surface 158. In some embodiments, the BARC layer 175 (illustrated in FIG. 5) is formed over the first electrode layer 148 before removing the surface portion of the first electrode layer 148 over the logic region surface 158.

According to some embodiments, an insulating layer 164 is formed over the logic region surface 158, and the first electrode layer 148. In some embodiments, the insulating layer 164 comprises a dielectric material with a relatively high dielectric constant such as a material comprising at least one of $Al_2O_3$, $ZrO_2$, $Ta_2O_5$, $HfO_2$, $La_2O_3$, $TiO_2$, $SiO_2$ or a composite thereof. In some embodiments, the insulating layer 164 comprises a standard dielectric material with a medium or low dielectric constant, such as $SiO_2$. In some embodiments, formation of the insulating layer 164 comprises at least one of thermal growth, chemical growth, atomic layer deposition (ALD), chemical vapor deposition (CVD), or plasma-enhanced chemical vapor deposition (PECVD).

According to some embodiments, a second electrode 168 is formed over the insulating layer 164 to form a capacitor 170. Although first 170a and second 170b capacitors are illustrated, any number of capacitors are contemplated. In some embodiments, formation of the second electrode 168 comprises at least one of atomic layer deposition (ALD), sputtering, or thermal evaporation, chemical vapor deposition (CVD). In some embodiments, the second electrode 168 comprises a conductive material. In some embodiments, the conductive material comprises at least one of Ti, TiN, Ta, TaN, TaC, W, Ir, Ru, Pt, aluminum, copper, polysilicon or a composite thereof. According to some embodiments, the insulating layer 164 is between at least one of the first electrode 166 and the second electrode 168, the first electrode layer 148 along the protective ring 174 and the second electrode 168, the second electrode 168 and the logic contact 116 in the fifth dielectric layer 122e or the second electrode 168 and the logic region surface 158.

In some embodiments, the capacitor 170 comprises the first electrode 166, the insulating layer 164, and the second electrode 168. In some embodiments, the capacitor 170 extends between the first dielectric layer 122 to a tenth dielectric layer 122. In some embodiments, a height 156 of the capacitor 170 is measured from the bottom surface 151 of the first electrode 166 to a top capacitor surface 179 of the second electrode 168. In some embodiments, the height 156 of the capacitor 170 is between about 250 nm to about 1200 nm.

In some embodiments, a width 154 of the capacitor 170 is measured between opposing side surfaces 181a and 181b of the second electrode 168. In some embodiments, the width 154 of the capacitor 170 is between about 30 nm to about 200 nm. According to some embodiments, an aspect ratio is a measurement of a ratio of the height 156 of the capacitor 170 to the width 154 of the capacitor 170. In some embodiments, the aspect ratio of the capacitor 170 is between about 5 to about 25.

In some embodiments, the capacitor 170 has at least a first capacitor unit 150, although any number of capacitor units are contemplated. In some embodiments, the first capacitor unit 150 comprises a first capacitor portion 140. In some embodiments, the first capacitor portion 140 comprises a first capacitor width 144. In some embodiments, the first capacitor width 144 is between about 15 nm to about 190 nm. In some embodiments, the first capacitor unit 150 comprises a second capacitor portion 142. In some embodiments, the second capacitor portion 142 comprises a second capacitor width 146. In some embodiments, the second capacitor width 146 is between about 30 nm to about 200 nm. In some embodiment, the first capacitor width 144 is less than the second capacitor width 146. In some embodiments, an area of the first capacitor portion 140 is less than an area of the second capacitor portion 142.

Figure 7:
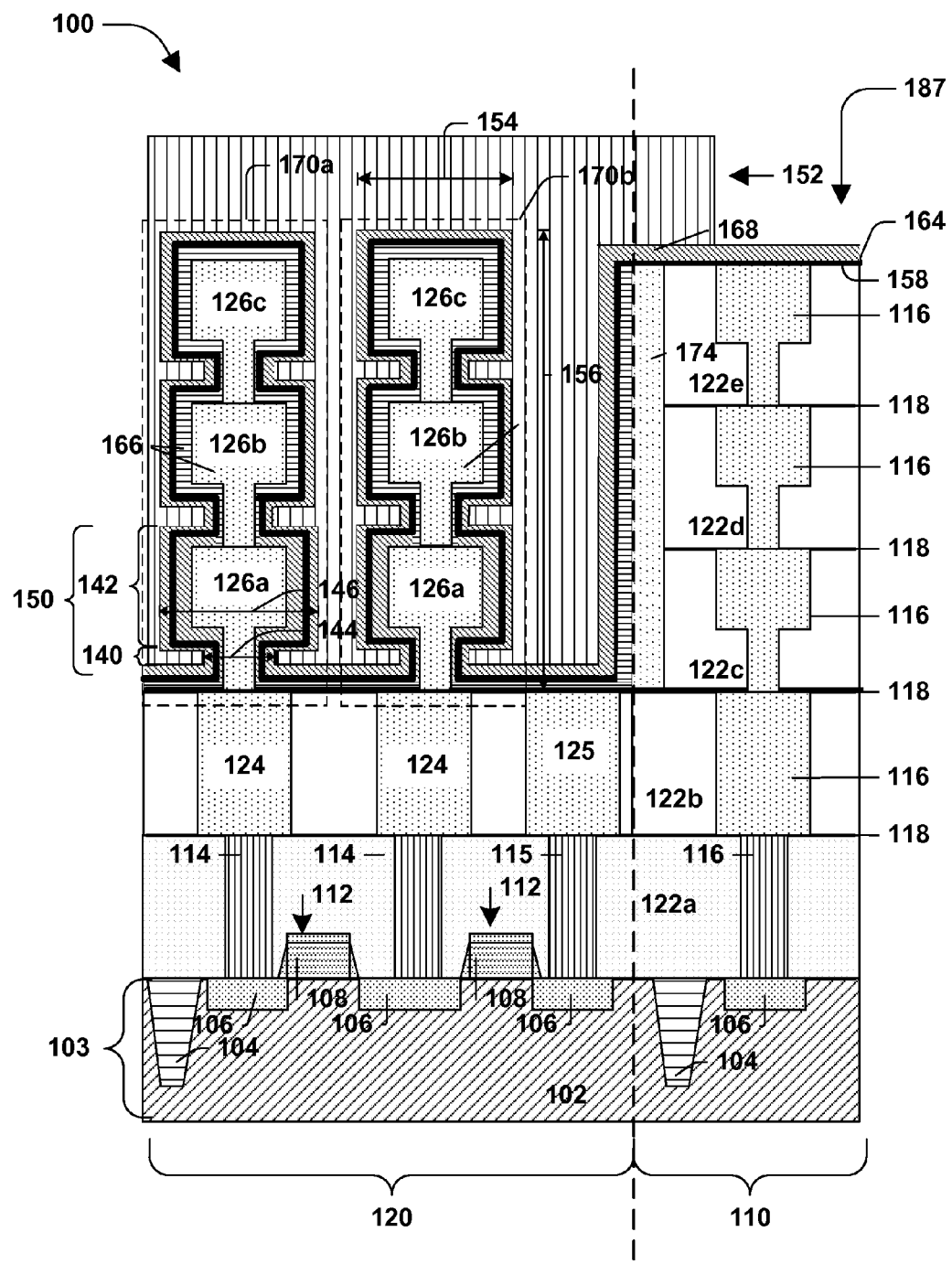
FIG. 7 illustrates a portion of a semiconductor arrangement, according to some embodiments.

Turning to FIG. 7, according to some embodiments a second mask layer 152 is formed over the second electrode 168 in the memory region 120 and a portion of the second electrode 168 over the protective ring 174, but not over the second electrode above the logic region surface 158. In some embodiments, formation of the second mask layer 152 comprises at least one of chemical vapor deposition (CVD), or other suitable methods. In some embodiments, the second mask layer 152 comprises at least one of oxides, silicon oxide, nitrides, silicon nitride, carbon or $Si_3N_4$.

Figure 8:
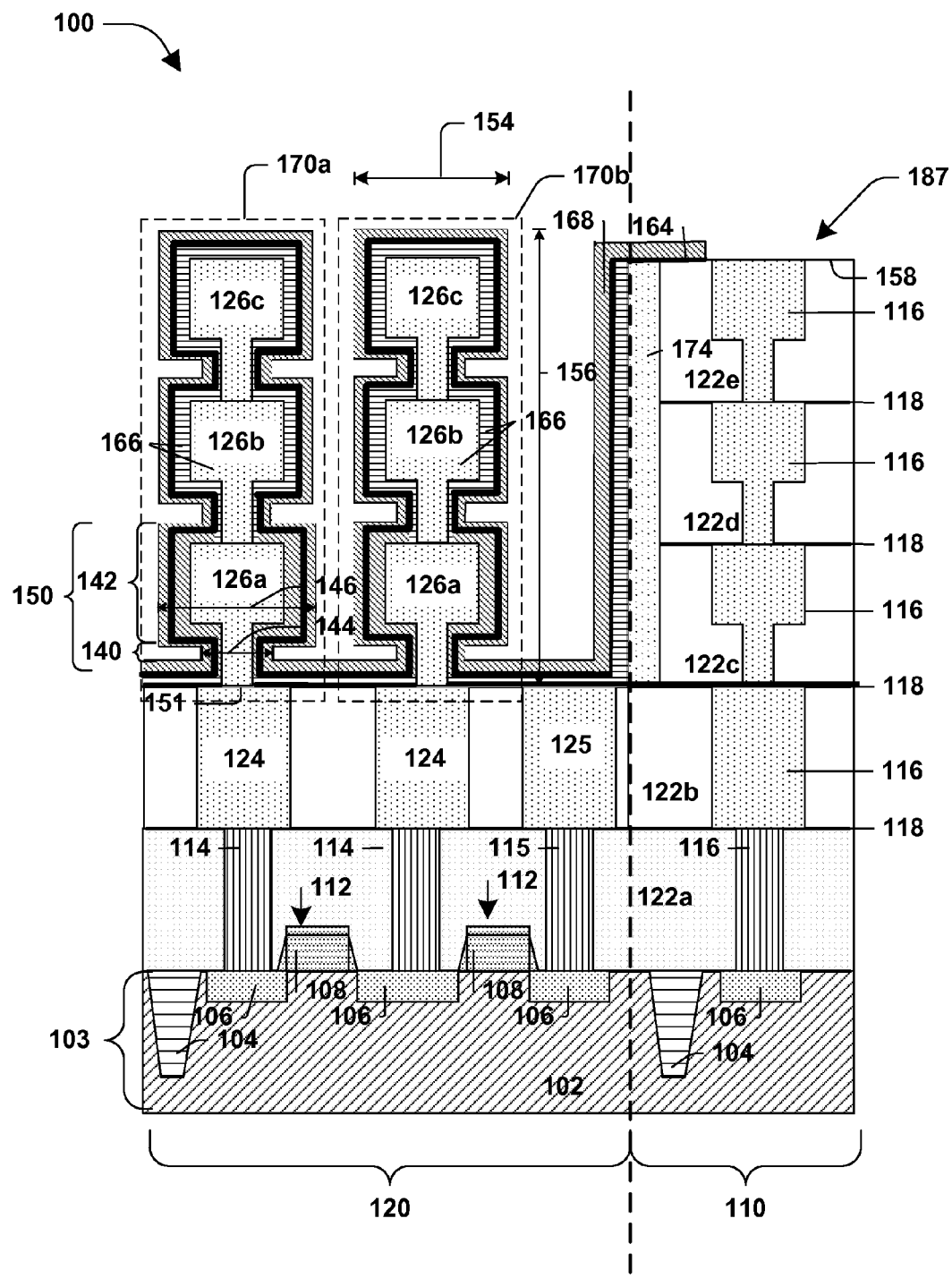
FIG. 8 illustrates a portion of a semiconductor arrangement, according to some embodiments.

Turning to FIG. 8, in some embodiments, an opening 187 is formed over the logic region surface 158, such that a top portion of the logic contact 116 in the fifth dielectric layer 122e is exposed by removing, such as by metal etching, portions of the second electrode 168 and the insulating layer 164 over the logic region surface 158. According to some embodiments, the second mask layer is removed after the opening 187 is formed.

Figure 9:
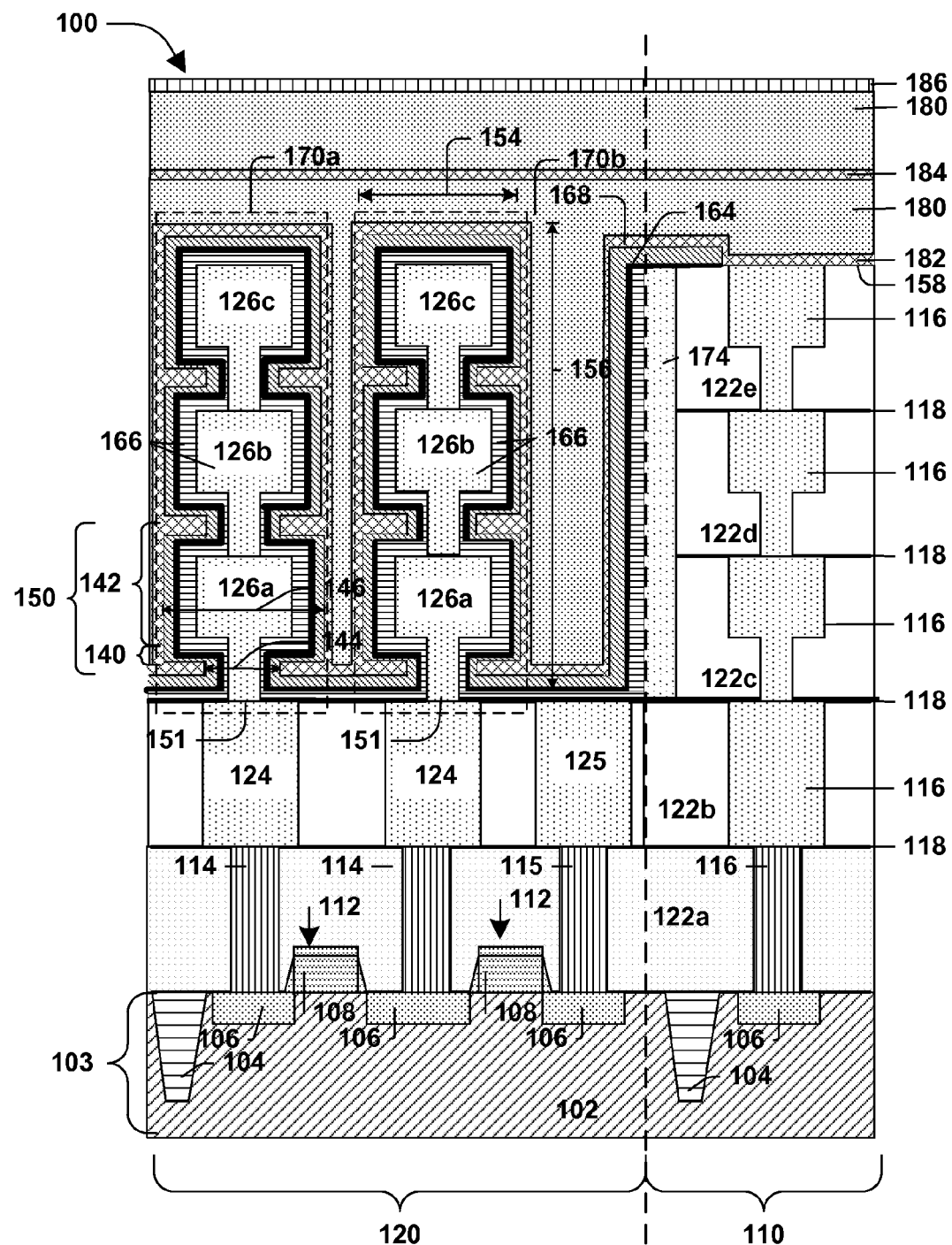
FIG. 9 illustrates a portion of a semiconductor arrangement, according to some embodiments.

Turning to FIG. 9, according to some embodiments, after the second mask layer 152 is removed an etch stop layer 182 is formed over the second electrode 168, the logic contact 116 in the fifth dielectric layer 122e and the logic region surface 158. In some embodiments, the etch stop layer 182 comprises at least one of SiC, SiN, SiCN, SiCO, or CN. In some embodiments, formation of the etch stop layer 182 comprises at least one of thermal growth, chemical growth, atomic layer deposition (ALD), chemical vapor deposition (CVD), or plasma-enhanced chemical vapor deposition (PECVD). In some embodiments, an oxide layer 180 is formed over the etch stop layer 182. In some embodiments, formation of the oxide layer 180 comprises at least one of deposition, chemical vapor deposition (CVD), or other suitable methods. In some embodiments, the oxide layer 180 comprises at least one of an oxide, silicon oxide, nitrides, silicon nitride, oxynitrides, or $SiO_2$.

According in some embodiments, an etch stop layer 184 is formed over the oxide layer 180. In some embodiments, the etch stop layer 184 comprises at least one of SiC, SiN, SiCN, SiCO, or CN. In some embodiments, formation of the etch stop layer 184 comprises at least one of thermal growth, chemical growth, atomic layer deposition (ALD), chemical vapor deposition (CVD), or plasma-enhanced chemical vapor deposition (PECVD). In some embodiments, at least one additional oxide layer 180 is formed over the etch stop layer 184. In some embodiments, multiple additional oxide layers, such as nine layers, are formed over the etch stop layer 184, with additional etch stop layers separating the additional oxide layers. In some embodiments, an antireflective coating (ARC) layer 186 is formed by CVD or other suitable methods over the oxide layer 180. In some embodiments, the ARC layer 186 comprises metal or metal oxide. In some methods, the ARC layer 186 is formed by deposition.

Figure 10:
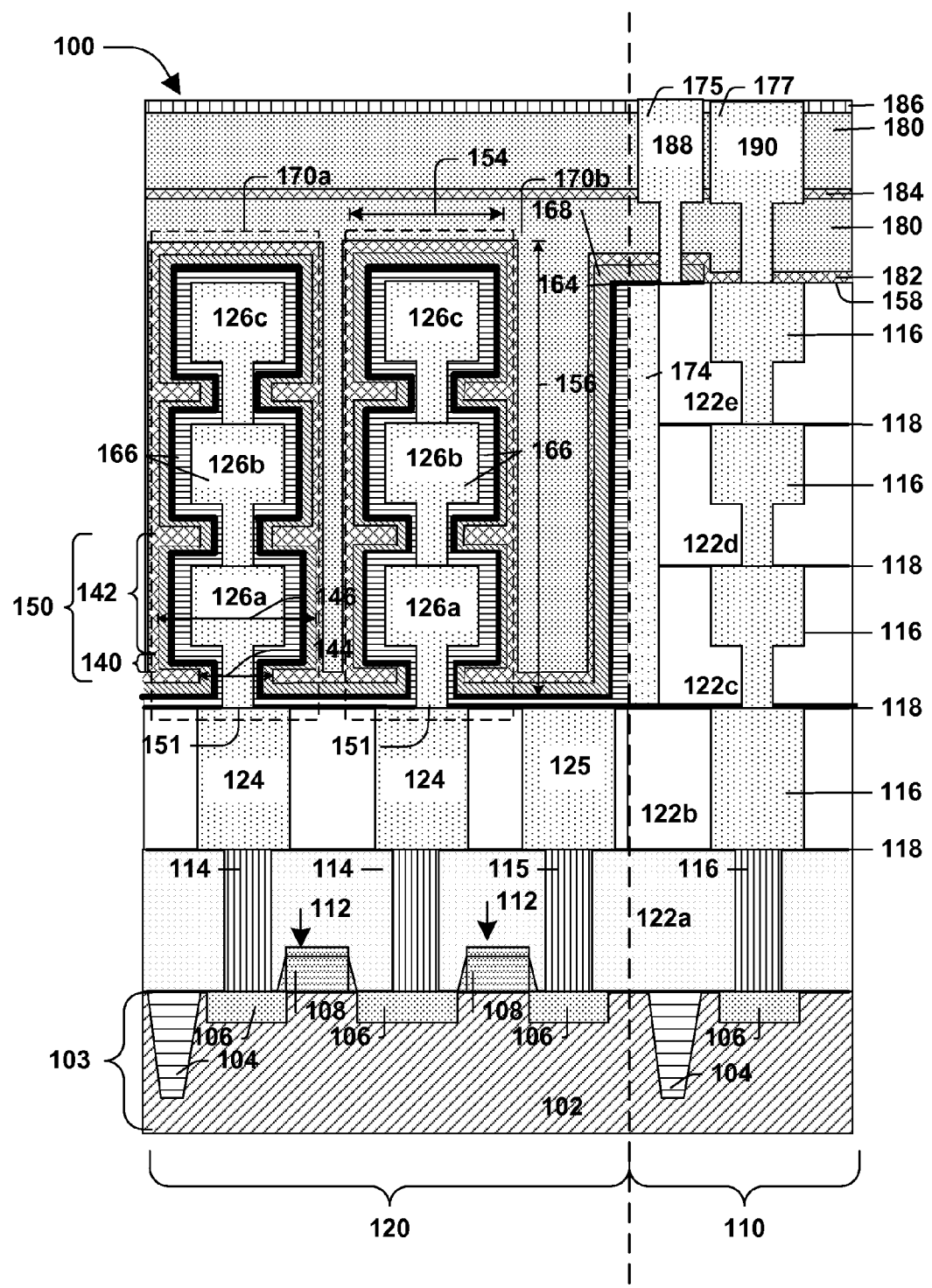
FIG. 10 illustrates a portion of a semiconductor arrangement, according to some embodiments.

Turning to FIG. 10, according to some embodiments a first oxide opening 175 and a second oxide opening 177 are formed in the ARC layer 186, the oxide layer 180 and the etch stop layers 184, 182. The formation of the first oxide opening 175 and the second oxide opening 177 comprising at least one of wet etching or dry etching.

According to some embodiments, a pick up contact 188 is formed in the first oxide opening 175. In some embodiments, the pick up contact 188 extends through the ARC layer 186, the oxide layer 180 and the etch stop layers 182, 184. In some embodiments, the pick up contact 188 is in contact with the insulating layer 164 and the second electrode 168. In some embodiments, formation of the pick up contact 188 comprises at least one of a single damascene process or dual damascene process.

According to some embodiments, a via contact 190 is formed in the second oxide opening 177. In some embodiments, the via contact 190 extends through the ARC layer 186, the oxide layer 180 and the etch stop layers 182, 184. In some embodiments, the via contact 190 is in contact with the logic contact 116. In some embodiments, formation of the via contact 190 comprises at least one of a single damascene process or dual damascene process.

Figure 11:
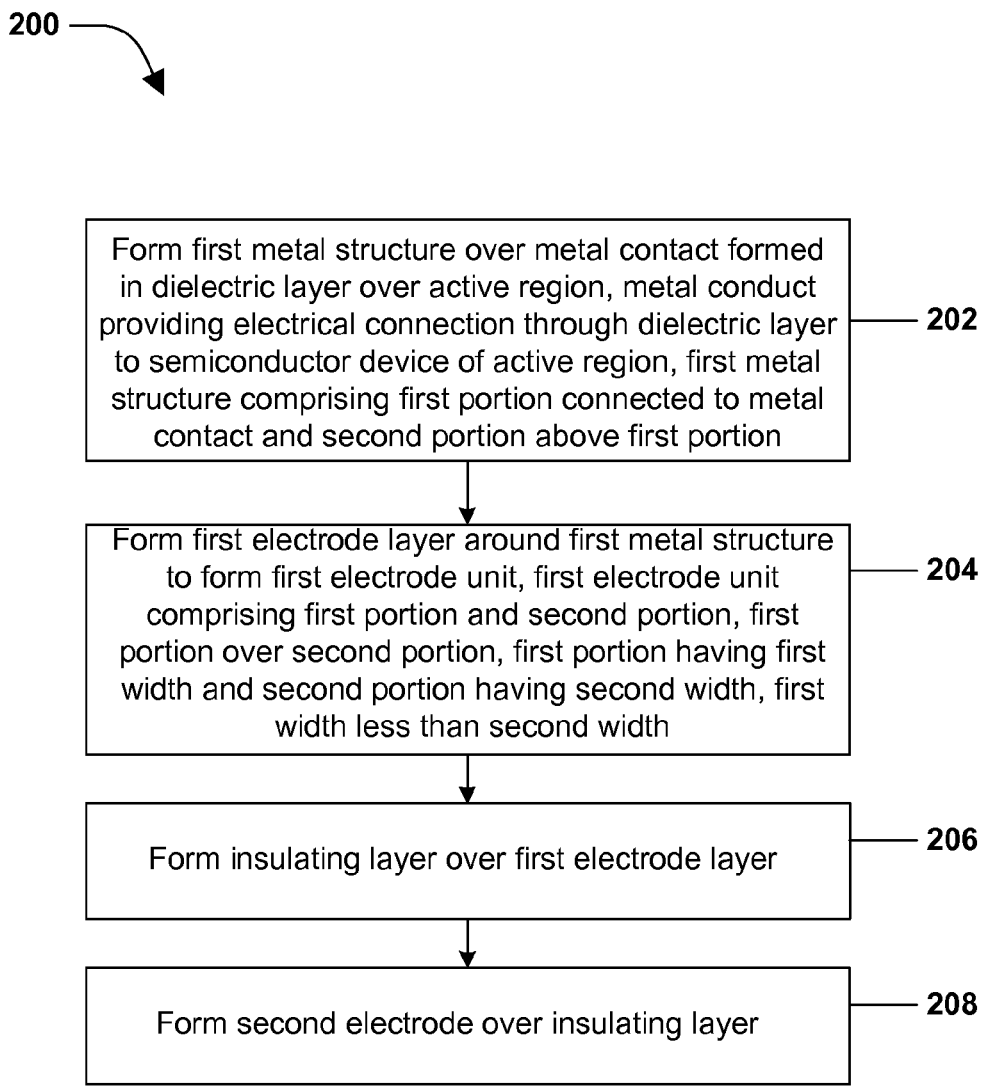
FIG. 11 illustrates a method of forming a semiconductor arrangement, according to some embodiments.

A method 200 of forming a semiconductor arrangement according to some embodiments, such as semiconductor arrangement 100, is illustrated in FIG. 11.

According to some embodiments, forming the semiconductor arrangement comprises forming a capacitor in a memory region of the semiconductor arrangement such that at 202 a first metal structure 126 is formed over a metal contact 124 formed in a dielectric layer 122 over an active region 103 of the semiconductor arrangement 100. In some embodiments, the metal contact 124 provides an electrical connection through the dielectric layer 122 to a semiconductor device 112 of the active region 103. In some embodiments, the first metal structure 126 comprises a first portion 138 connected to the metal contact and a second portion 136 above the first portion 138, as illustrated in FIG. 4.

At 204, according to some embodiments, a first electrode layer 148 is formed around the first metal structure 126a to form a first electrode unit 134, the first electrode unit 134 comprising a first portion 130 and a second portion 132 above the first portion, the first portion having a first width, and the second portion having a second width, the first width less than the second width, as illustrated in FIG. 4.

At 206, according to some embodiments, an insulating layer 164 is formed over the first electrode layer 148, as illustrated in FIG. 6.

At 208, according to some embodiments, a second electrode 168 is formed over the insulating layer 164 to form the capacitor 170, as illustrated in FIG. 6.

According to some embodiments, a semiconductor arrangement comprises an active region comprising a semiconductor device, and a capacitor. In some embodiments, the capacitor comprises a first electrode over a metal contact formed in a dielectric layer over the active region. In some embodiments, the metal contact provides an electrical connection through the dielectric layer to the semiconductor device. In some embodiments, the first electrode comprises a first electrode unit. In some embodiments, the first electrode unit comprises a first portion connected to the metal contact and a second portion above the first portion. In some embodiments, the first portion has a first width, and the second portion has a second width. In some embodiments, the first width is less than the second width.

According to some embodiments, a method of forming a semiconductor arraignment comprises forming a capacitor in a memory region of the semiconductor arrangement. In some embodiments, the formation of the capacitor comprises forming a first metal structure over a metal contact formed in a dielectric layer over an active region of the semiconductor arrangement. In some embodiments, the metal contact provides an electrical connection through the dielectric layer to a semiconductor device of the active region. In some embodiments, the first metal structure comprises a first portion connected to the metal contact and a second portion above the first portion. In some embodiments, the formation of the capacitor comprises forming a first electrode layer around the first metal structure to form a first electrode unit. In some embodiments, the first electrode unit comprises a first portion and a second portion above the first portion, the first portion having a first width, and the second portion having a second width. In some embodiments, the first width is less than the second width. In some embodiments, the formation of the capacitor comprises forming an insulating layer over the first electrode layer and forming a second electrode over the insulating layer.

According to some embodiments, a semiconductor arrangement comprises an active region comprising a semiconductor device and a capacitor. In some embodiments the capacitor comprises a first electrode over a metal contact formed in a dielectric layer over the active region. In some embodiments, the metal contact provides an electrical connection through the dielectric layer to the semiconductor device. In some embodiments, the first electrode comprises a first electrode unit, the first electrode unit comprising a first portion connected to the metal contact and a second portion above the first portion. In some embodiments, the first portion of the first electrode unit has a first width, the second portion of the first electrode unit has a second width. In some embodiments, the first width is less than the second width. In some embodiments, the first electrode unit comprises a first metal structure and a first electrode layer around the first metal structure. In some embodiments, the first portion of the first electrode unit comprises a first portion of the first metal structure and a first portion of the first electrode layer. In some embodiments, the second portion of the first electrode unit comprises a second portion of the first metal structure and a second portion of the first electrode layer. In some embodiments, the capacitor comprises an insulating layer over the first electrode layer and a second electrode over the insulating layer.

Although the subject matter has been described in language specific to structural features or methodological acts, it is to be understood that the subject matter of the appended claims is not necessarily limited to the specific features or acts described above. Rather, the specific features and acts described above are disclosed as embodiment forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as chemical vapor deposition (CVD), physical vapor deposition (PVD), plasma enhanced chemical vapor deposition (PECVD), or atomic layer deposition (ALD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor arrangement comprising:
    an active region comprising a semiconductor device; and
    a capacitor comprising:
        a first electrode over a metal contact formed in a dielectric layer over the active region, the metal contact providing an electrical connection through the dielectric layer to the semiconductor device, the first electrode comprising a first electrode unit comprising:
            a first metal structure; and
            a first electrode layer in contact with the first metal structure;
        a second electrode; and
        an insulating layer between the first electrode and the second electrode, wherein:
            the first electrode unit is defined by a first portion having a first width and a second portion above the first portion and having a second width greater than the first width,
            the first portion of the first electrode unit comprises a first portion of the first metal structure and a first portion of the first electrode layer, and
            the first portion of the first metal structure is in direct, physical contact with at least two sidewalls of the first portion of the first electrode layer.

2. The semiconductor arrangement of claim 1, the first portion of the first metal structure in contact with the metal contact.

3. The semiconductor arrangement of claim 1, wherein:
    the second portion of the first electrode unit comprises a second portion of the first metal structure and a second portion of the first electrode layer, and
    the second portion of the first metal structure is in direct, physical contact with at least two sidewalls of the second portion of the first electrode layer.

4. The semiconductor arrangement of claim 3, the first portion of the first metal structure having a third width and the second portion of the first metal structure having a fourth width different than the third width.

5. The semiconductor arrangement of claim 1, the first electrode comprising multiple electrode units.

6. The semiconductor arrangement of claim 1, the first electrode in contact with the metal contact.

7. The semiconductor arrangement of claim 1, the first electrode layer comprising polysilicon.

8. The semiconductor arrangement of claim 1, the capacitor having an aspect ratio of between about 5 to about 25.

9. The semiconductor arrangement of claim 1, the capacitor having a height of between about 250 nm to about 1200 nm.

10. The semiconductor arrangement of claim 1, the capacitor having a first capacitor width of between about 30 nm to about 190 nm.

11. The semiconductor arrangement of claim 1, the capacitor having a second capacitor width of between about 30nm to about 200nm.

12. The semiconductor arrangement of claim 1, comprising between about 1 to about 5 dielectric layers between the active region and a bottom surface of the capacitor.

13. The semiconductor arrangement of claim 1, comprising between about 2 to about 10 oxide layers above the capacitor.

14. The semiconductor arrangement of claim 1, comprising an etch stop layer between the dielectric layer and a second dielectric layer.

15. A semiconductor arrangement comprising:
    an active region comprising a semiconductor device; and
    a capacitor comprising:

a first electrode in contact with a metal contact formed in a dielectric layer over the active region, wherein:
the metal contact provides an electrical connection through the dielectric layer to the semiconductor device,
the first electrode comprises a first electrode unit,
the first electrode unit is defined by a first portion connected to the metal contact and a second portion above the first portion,
the first portion has a first width and the second portion has a second width greater than the first width, and
the first electrode unit comprises:
a first metal structure; and
a first electrode layer around the first metal structure, wherein:
the first portion of the first electrode unit comprises a first portion of the first metal structure and a first portion of the first electrode layer,
the first portion of the first metal structure is in direct, physical contact with at least two sidewalls of the first portion of the first electrode layer, and
the second portion of the first electrode unit comprises a second portion of the first metal structure and a second portion of the first electrode layer;
an insulating layer over the first electrode layer; and
a second electrode over the insulating layer and surrounding the first electrode.

16. The semiconductor arrangement of claim 15, comprising a protective ring within at least one of a logic region or a memory region of the semiconductor arrangement, the memory region comprising the capacitor.

17. A semiconductor arrangement comprising:
an active region comprising a semiconductor device;
a dielectric layer over the active region; and
a capacitor over the dielectric layer, the capacitor comprising:
a first electrode having a non-linear sidewall and comprising a first metal structure and a first electrode layer in direct, physical contact with a sidewall of the first metal structure and a top surface of the first metal structure;
a second electrode; and
an insulating layer between the first electrode and the second electrode.

18. The semiconductor arrangement of claim 17, the first electrode layer comprising polysilicon.

19. The semiconductor arrangement of claim 17, comprising a metal contact extending through the dielectric layer and coupling the capacitor to the active region.

20. The semiconductor arrangement of claim 19, the metal contact in contact with the first electrode.

* * * * *